(12) United States Patent
Pancoast

(10) Patent No.: US 9,893,731 B1
(45) Date of Patent: Feb. 13, 2018

(54) PROGRAMMABLE APPLICATION-SPECIFIC INTEGRATED CIRCUIT

(71) Applicant: Lockheed Martin Corporation, Bethesda, MD (US)

(72) Inventor: Eric T. Pancoast, Langhorne, PA (US)

(73) Assignee: Lockheed Martin Corporation, Bethesda, MD (US)

( * ) Notice: Subject to any disclaimer, the term of this patent is extended or adjusted under 35 U.S.C. 154(b) by 171 days.

(21) Appl. No.: 13/710,840

(22) Filed: Dec. 11, 2012

(51) Int. Cl.
   *H03K 19/173* (2006.01)
   *H01L 23/52* (2006.01)
   *B82Y 99/00* (2011.01)

(52) U.S. Cl.
   CPC .......... *H03K 19/173* (2013.01); *B82Y 99/00* (2013.01)

(58) Field of Classification Search
   CPC ............ H03K 19/17736; H03K 19/177; H01L 224/48227; H01L 224/73265; B82Y 10/00
   See application file for complete search history.

(56) References Cited

U.S. PATENT DOCUMENTS

| | | | | |
|---|---|---|---|---|
| 6,574,130 B2* | 6/2003 | Segal | ...................... | B82Y 10/00 257/E21.582 |
| 6,706,402 B2* | 3/2004 | Rueckes | ................ | B82Y 10/00 423/447.1 |
| 6,969,651 B1* | 11/2005 | Lu | .......................... | B82Y 10/00 257/E21.662 |
| 7,324,350 B2 | 1/2008 | Heck et al. | | |
| 7,382,648 B2* | 6/2008 | Bockrath | ............... | B82Y 10/00 365/151 |
| 7,511,532 B2* | 3/2009 | Derharcobian | ........ | B82Y 10/00 257/130 |
| 7,612,270 B1* | 11/2009 | Zhu | ...................... | H01H 1/0094 257/314 |
| 7,724,032 B2* | 5/2010 | Hutton | ............. | H03K 19/17732 326/41 |

(Continued)

FOREIGN PATENT DOCUMENTS

| EP | 2363957 | * | 9/2011 | ......... H03K 19/0177 |
|---|---|---|---|---|
| EP | 2363957 A1 * | | 9/2011 | ............. B82Y 10/00 |

OTHER PUBLICATIONS

Chen et al., Fully Integrated Graphene and Carbon Nanotube Interconnects for Gigahertz High-Speed CMOS Electronics, IEEE Transactions on Electron Devices, vol. 57, No. 11, Nov. 2010.*

(Continued)

*Primary Examiner* — Alexander H Taningco
*Assistant Examiner* — Nelson Correa
(74) *Attorney, Agent, or Firm* — Howard IP Law Group PC

(57) ABSTRACT

An integrated-circuit field-programmable gate array comprising a plurality of arrayed logic elements. The array includes a plurality of first electrical conductors extending along at least portions of the array, and a plurality of second electrical conductors extending along at least portions of the array. The first conductors cross the second conductors at switch cell locations. The first and second conductors are electrically discontinuous at the switch cell locations so that each switch cell is associated with first and second ends of one of the first conductors, and is also associated with first and second ends of one of the second conductors. A plurality of electrical nanotube switches are provided and associated with each of the switch cells.

11 Claims, 8 Drawing Sheets

(56) References Cited

U.S. PATENT DOCUMENTS

| | | | | |
|---|---|---|---|---|
| 7,847,588 | B2* | 12/2010 | Bertin | B82Y 10/00 326/39 |
| 8,063,455 | B2* | 11/2011 | Kordus et al. | 257/415 |
| 8,117,436 | B2* | 2/2012 | Zhang | H03K 19/17752 712/229 |
| 8,159,266 | B1* | 4/2012 | Madurawe | H01L 27/0207 326/101 |
| 8,188,763 | B2* | 5/2012 | Bertin | B82Y 10/00 257/209 |
| 8,339,844 | B2* | 12/2012 | Schmit | H01L 27/24 257/530 |
| 8,875,080 | B1* | 10/2014 | Parks | G06F 17/5045 716/128 |
| 2005/0052894 | A1* | 3/2005 | Segal | B82Y 10/00 365/129 |
| 2010/0079165 | A1* | 4/2010 | Bertin | B82Y 10/00 326/38 |
| 2010/0231321 | A1 | 9/2010 | Czajkowski | |

OTHER PUBLICATIONS

Chen et al., Fully Integrated Graphene and Carbon Nanotube Interconnects for Gigahertz High-Speed CMOS Electronics, IEEE Transactions on Electron Devices, vol. 57, No. 11.*

Nantero Inc., Woburn, MA, 01801, Carbon Nanotube memory and swtiches; www.nantero.com.

Altera HardCopy II device; Altera Corporation, San Jose, California, 95134; www.altera.com/products/devices/hardcopyii/hr2-index.jsp.

\* cited by examiner

PROGRAMMABLE APPLICATION-SPECIFIC INTEGRATED CIRCUIT

FIELD OF THE INVENTION

The disclosure relates to integrated circuits. More particularly, the disclosure relates to a programmable Application-Specific Integrated Circuit.

BACKGROUND

An Application-Specific Integrated Circuit (ASIC) is an integrated circuit designed to implement a particular function, and generally no other function. The logic functions of the ASIC are first designed on "paper," possibly in a symbolic manner, and the paper design is then used to design the functions of the integrated circuit. The transfer from the paper design to the actual product may require implementation of various circuits, which in combination make up a single logic element. The actual fabrication may involve masking, deposition of semiconductor materials onto a substrate, etching, deposition of metal layers onto the substrate, and much more.

For example, FIG. 1D is a simplified diagram in block and schematic form illustrating a traditional structured ASIC constructed with a customized interconnect matrix. Logic elements 31 may be interconnected internally to the logic element block and externally to the logic element block via a masked metal interconnect matrix 32. In its simplest form, interconnect matrix 32 may comprise a single layer of horizontal metal interconnect and a single layer of vertical metal interconnect. At the time of masking, these horizontal and vertical metal interconnects may be selectively joined by forming conductive vias 33 at predetermined overlapping points to form an ASIC implementing a particular function. As no vias are formed where there are no desired connections, ASICs of the prior art do not require initialization, but are configured at the time of manufacture and may not be modified in the field. As a result, the use of ASICs is typically only economically justified when the design and nonrecurring cost of fabrication of the integrated circuit can be amortized over a large number of units.

A Field-Programmable Gate Array (FPGA) is a logic network that can be programmed into the desired device after its manufacture. The gate arrays consist of or include elemental logic gates or logic blocks, the input and output ports of which are interconnected by switches. The elemental logic elements may include gates, lookup tables, Random Access Memories (RAMs), and the like. The interconnection switches may be in the form of reprogrammable cells, or they may be one-use fuse-like elements. The logic network assembled by the use of fuse-like switch elements are permanently set in the original programmed form, while those using reconfigurable elements (typically SRAM) can be reprogrammed to various different logic networks. Thus, a "standard" FPGA can be programmed, in many cases, to perform any of a large number of functions. In this way, a properly programmed FPGA may be configured to perform the same functions as any one of a plurality of ASICs. Thus, while FPGAs may be initially more expensive than ASICs, their nonrecurring development costs and re-configurability may provide an economic benefit.

As mentioned, FPGAs require after-manufacture specialized programming in order to convert the array for the specialized use. This programming sets the programmable interconnection fuses, switches or switch cells to the desired states to implement the desired function. The switch cells may be viewed as being non-volatile, as in the case of a fused-based FPGA, or as being volatile in a manner similar to random-access memory (RAM) cells, in that they retain a set switch state so long as power is applied, and lose the set state when power is removed. That means that the volatile FPGA must be re-programmed in some manner after a loss of power. This reprogramming may be performed at start-up, using some form of nonvolatile stored memorized information relating to the desired switch cell states. Such memorized information may come from a remote computer with a hard drive preprogrammed with the desired switch states, or from a nonvolatile memory such as a flash memory similarly preprogrammed.

FIG. 1A is a simplified diagram in block and schematic form illustrating how specific functional logic blocks of a FPGA may be constructed using an array of standard multiplexers (MUXs or MPXs) such as two or multi-input multiplexers. Arrays of two-input multiplexers, some of which are illustrated in FIG. 1A as $1A1_1$ and $1A1_2$ are interconnected by a North-South interconnection matrix 1A2 and an East-West interconnection matrix 1A3. A detail of the contents of simplified two-input multiplexer array $1A1_2$ is shown as 1A4, with three two-input multiplexers $1A4_1$, $1A4_2$, and $1A4_3$ in a first stage and one two-input multiplexer $1A4_4$ in the second stage, thus providing a nine input and one output logic function. As an example, this multiplexer array is shown to be programmed to give the logic function y=(a & b)|c, to yield the logic gate function equivalent shown in 1A5.

FIG. 1B is a simplified diagram in block and schematic form illustrating how specific functional logic blocks of a FPGA may alternatively be constructed using an array of standard Look-Up Tables, or LUTs. Arrays of Look-Up Tables, some of which are designated $1B1_1$ and $1B1_2$, are interconnected by a North-South interconnection matrix 1B2 and an East-West interconnection matrix 1B3, much as in FIG. 1A. A simplified detail of the contents of three-input one-output LUT $1B1_2$ is shown as 1B4. The LUT $1B1_2$ details as shown in 1B4 include eight rows of table entry required to implement the desired logic function. As an example, this LUT is shown to be programmed to give the logic function y=(a & b)|c, to yield the logic gate function equivalent shown in 1B5 (for illustrative purposes, this is the same logic function implemented in FIG. 1A).

FIG. 1C is a simplified diagram in block and schematic form illustrating how MUX-Based or LUT-Based logic elements 1C1 of a FPGA may be interconnected to the North-South interconnect matrix or bus 1C2 and the East-West interconnect matrix or bus 1C3. In FIG. 1C, the interconnections between the logic elements 1C1 and the interconnect matrices is accomplished by means of a plurality of CMOS transistor switches, one of which is designated 1C4. Each CMOS transistor switch 1C4 is switched on or off by a static random access memory SRAM memory cell 105. Similar SRAM bits 1C4 with transistor switches 105 are used inside logic elements 1C1 to configure (i.e. program) the functionality of the logic elements. For an SRAM-Based FPGA, the SRAM cells are initially in an unknown state at power-up, and are then, at power-up initialization time, programmed to the proper logic one or zero state via an external non-volatile (typically FLASH) memory source or from an external host processor 106 which provides a bit stream 1C7. Thus the functionality, or characterization, of the FPGA may be modified in the field by loading a different initialization bit stream.

More recently, the functions available on FPGAs have become more complex. That is to say, the elemental blocks available for programmable interconnection have tended to become more complex. For example, in addition to providing simple gates, some FPGAs may provide embedded adders, multipliers, memories, and microprocessors and related peripherals, which are capable of being programmably-interconnected by the programmable switches of the array. This complexity allows FPGAs to be used in various functions such as digital radio, radar signal processing, and in massively parallel applications.

The ASIC can generally be expected to use less power, and to be faster and less bulky than a corresponding-function programmed FPGA. The design and manufacture of ASICs may be difficult and time-consuming due to the process and manufacturing steps involved. The FPGA, on the other hand, allows for easy experimentation to optimize performance, and is cheaper for quantities less than some threshold. The FPGA requires a separate programming step after manufacturing, and this step must be customized to the desired application. Due to their various different advantages and disadvantages, ASICs and FPGAs are both in use.

Accordingly, it would be desirable to have a device that has all the advantages of a FPGA and an ASIC, with none of the disadvantages of either.

SUMMARY

An integrated-circuit field-programmable gate array comprising a plurality of arrayed logic elements. The array includes a plurality of first electrical conductors extending along at least portions of the array, and a plurality of second electrical conductors extending along at least portions of the array. The first conductors cross the second conductors at switch cell locations. The first and second conductors are electrically discontinuous at the switch cell locations so that each switch cell is associated with first and second ends of one of the first conductors, and is also associated with first and second ends of one of the second conductors. A plurality of electrical nanotube switches are provided and associated with each of the switch cells.

In one embodiment of the present disclosure, an IC FPGA is provided. The FPGA comprises a plurality of arrayed logic elements, at least some of the logic elements including electrical signal input and output ports. A plurality of first electrical conductors are provided, and extend in particular directions along at least portions of the array, and a further plurality of second electrical conductors are provided and extend in other directions, different from the particular directions, along at least the portions of the array. The first conductors cross the second conductors at switch cell locations, the first and second conductors being electrically discontinuous at the switch cell locations so that each switch cell is associated with first and second ends of one of the first conductors, and is also associated with first and second ends of one of the second conductors.

Electrical connections are provided among at least some of the signal input and output ports of the logic elements and at least some of the first and second conductors. At least first, second, third, fourth, fifth, and sixth electrical nanotube switches are provided, and associated with each of the switch cells. Each of the nanotube switches are settable to a particular state upon the application of a setting voltage, and retain the particular state in the absence of power applied to the FPGA.

The first one of the nanotube switches associated with one of the switch cells provides a switchable connection between the first and second ends of one of the first conductors having a discontinuity in one of the switch cells. The second one of the nanotube switches associated with one of the switch cells provides a switchable connection between the first and second ends of one of the second conductors. The third one of the nanotube switches associated with one of the switch cells provides a switchable connection between the first end of the one of the first conductors and the first end of the one of the second conductors. The fourth one of the nanotube switches associated with the one of the switch cells provides a switchable connection between the first end of the one of the first conductors and the second end of the one of the second conductors. The fifth one of the nanotube switches associated with the one of the switch cells provides a switchable connection between the second end of the one of the first conductors and the first end of the one of the second conductors. Finally, the sixth one of the nanotube switches associated with the one of the switch cells provides a switchable connection between the second end of the one of the first conductors and the second end of the one of the second conductors.

Embodiments of the present disclosure may also include an initialization voltage arrangement for selectively applying a predetermined setting voltage to the first, second, third, fourth, fifth and sixth nanotube switches for setting the states of the first, second, third, fourth, fifth, and sixth nanotube switches of each of the switch cells. This initialization voltage arrangement thereby establishes a selected configuration of the logic elements to cause the field-programmable switch array to perform at least one selected function.

DETAILED DESCRIPTION OF THE INVENTION

Figure 1A:
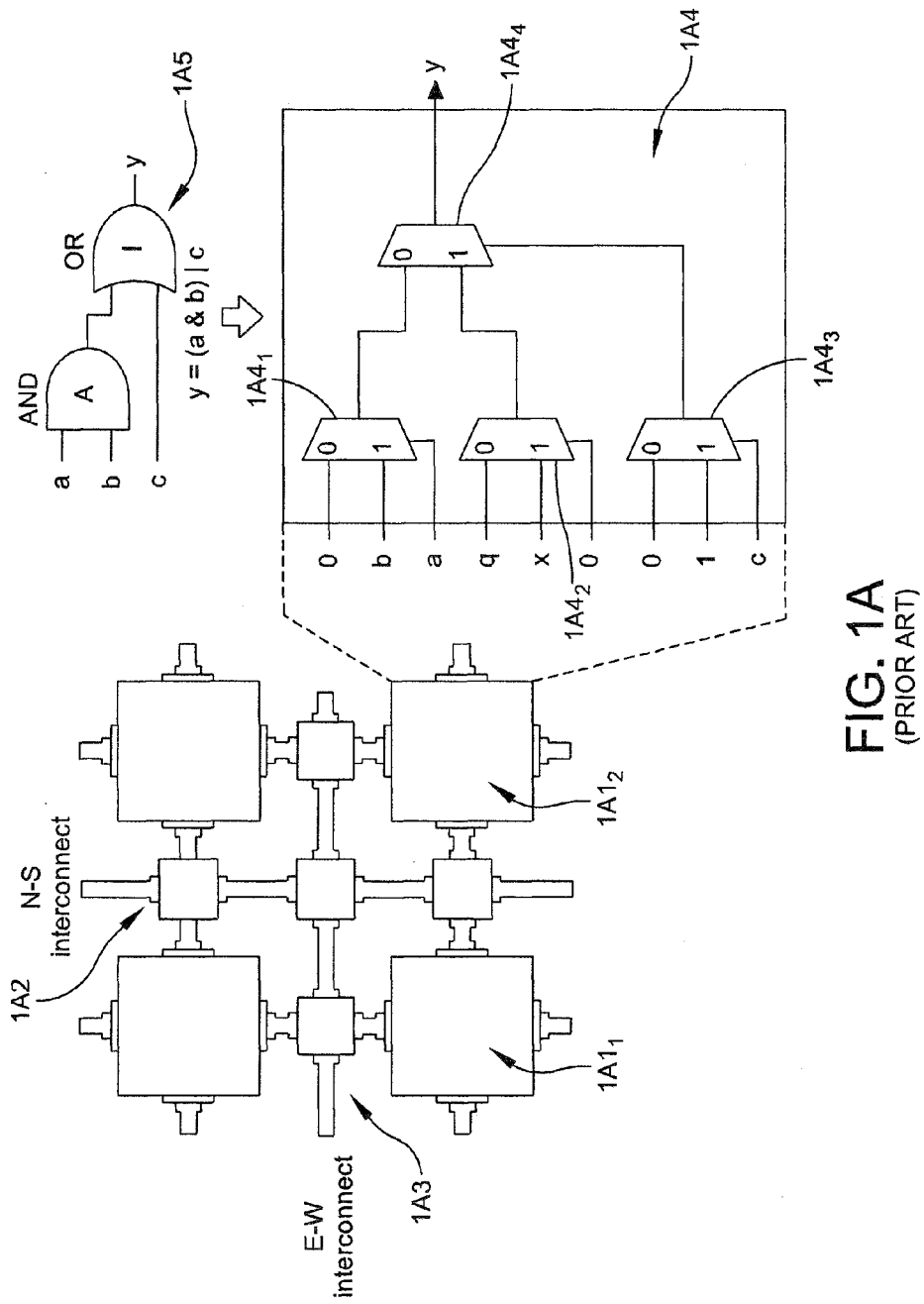
FIG. 1A is a simplified black diagram illustrating the function of an FPGA utilizing an array of multiplexers according to the prior art.
Figure 1B:
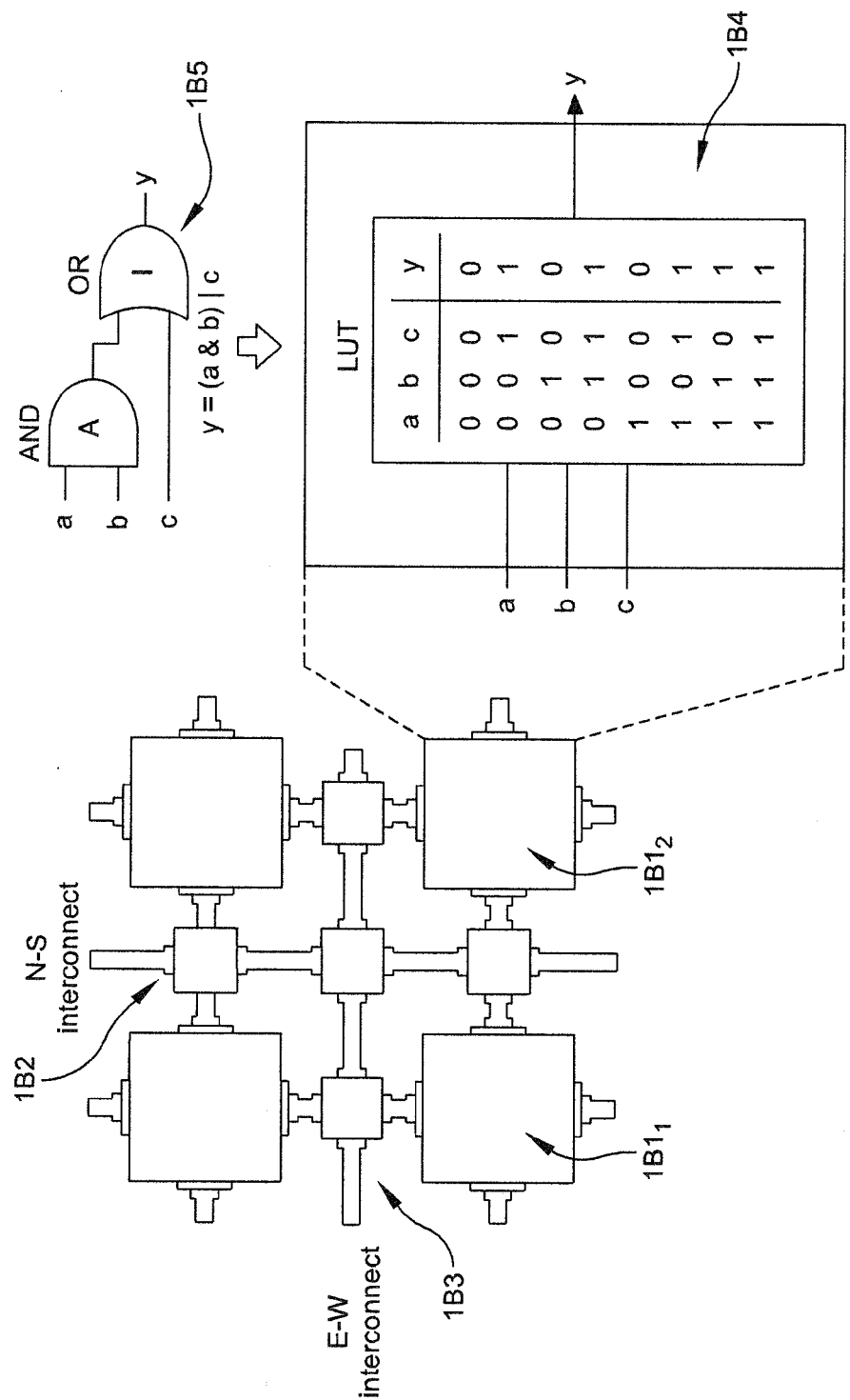
FIG. 1B is a simplified black diagram illustrating the function of an FPGA utilizing an array of Look-Up Tables according to the prior art.
Figure 1C:
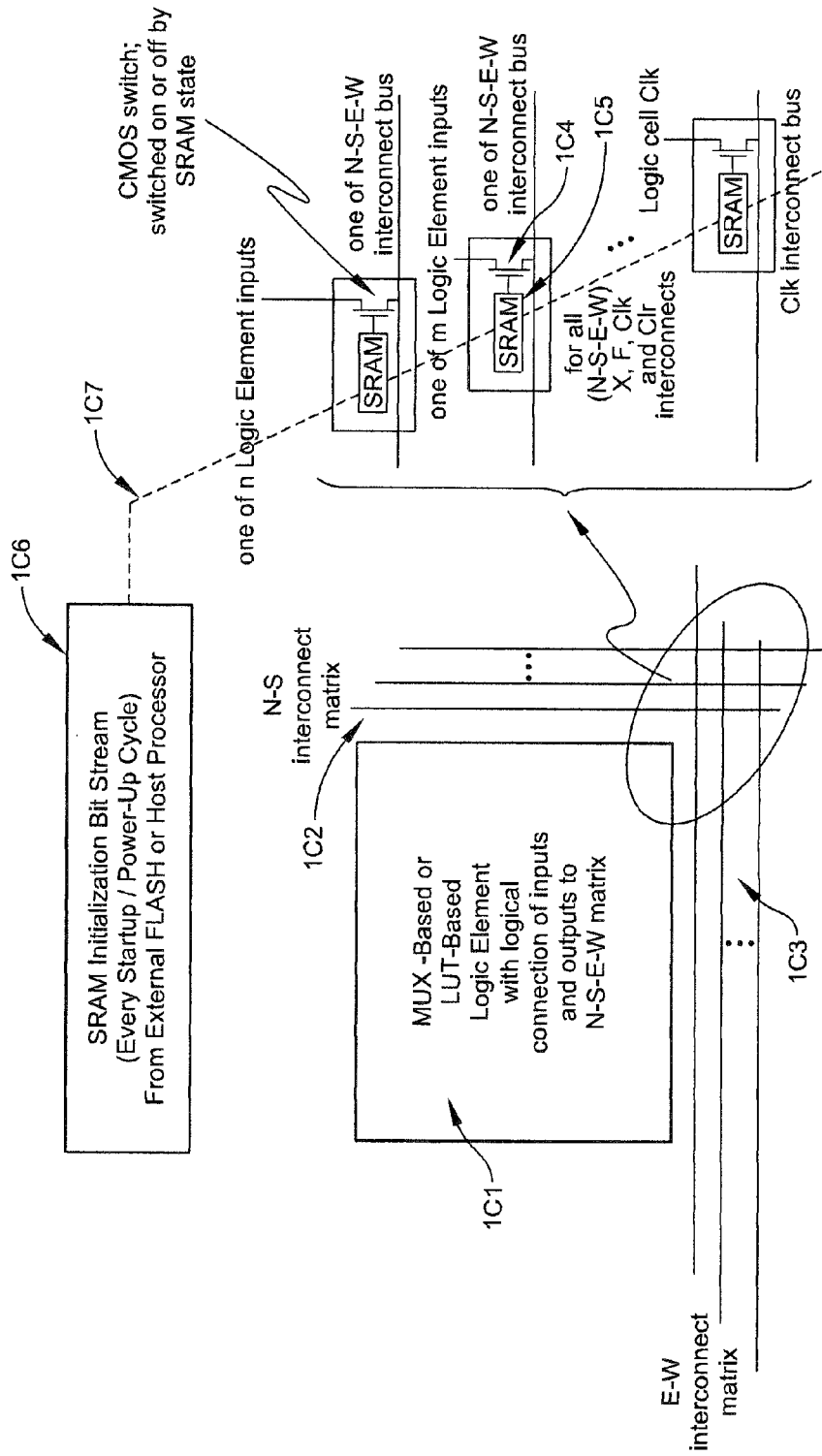
FIG. 1C is a simplified black diagram illustrating the interconnect between logic elements of the FPGAs of FIGS. 1A and 1B.
Figure 1D:
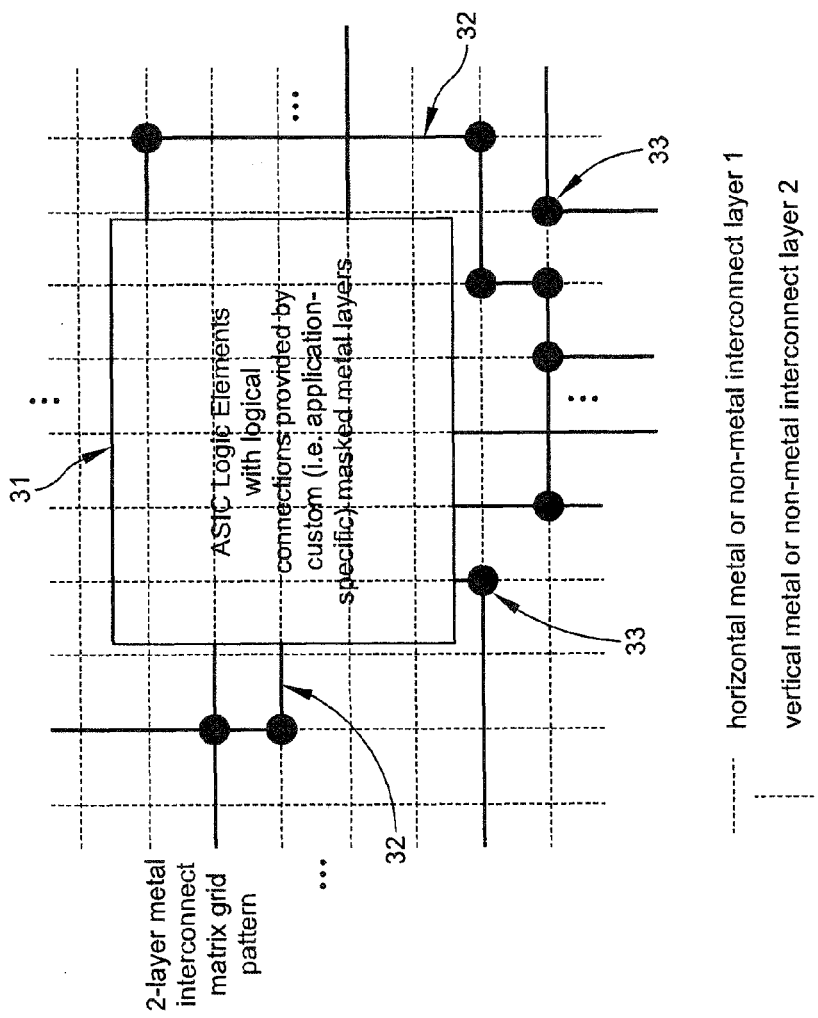
FIG. 1D is a simplified schematic illustration of a pre-configured ASIC formed by masked metal layers according to the prior art.

It is to be understood that the figures and descriptions of the present invention have been simplified to illustrate elements that are relevant for a clear understanding of the present invention, while eliminating, for purposes of clarity, many other elements found in FPGAs, ASICs, and carbon nanotube (CNT) and/or Graphene-based switching systems. However, because such elements are well known in the art, and because they do not facilitate a better understanding of the present invention, a discussion of such elements is not provided herein. The disclosure herein is directed to all such variations and modifications known to those skilled in the art.

In the following detailed description, reference is made to the accompanying drawings that show, by way of illustration, specific embodiments in which the invention may be practiced. It is to be understood that the various embodiments of the invention, although different, are not necessarily mutually exclusive. Furthermore, a particular feature, structure, or characteristic described herein in connection with one embodiment may be implemented within other embodiments without departing from the scope of the invention. In addition, it is to be understood that the location or arrangement of individual elements within each disclosed embodiment may be modified without departing from the scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout several views.

Figure 2:
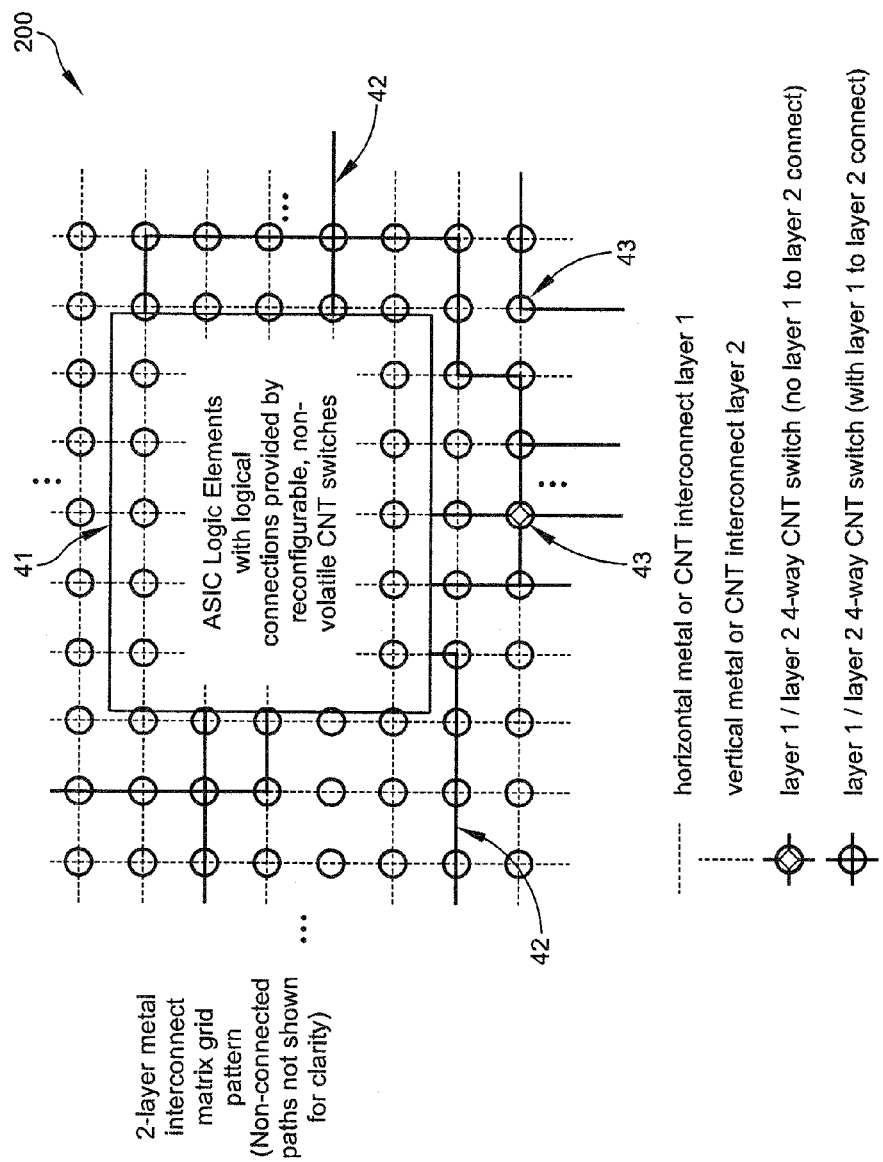
FIG. 2 is a simplified schematic illustration of a programmable ASIC according to an embodiment of the present invention.

FIG. 2 is a simplified diagram in block and schematic form illustrating a "field-programmable" ASIC 200 according to an embodiment of the present invention. ASIC 200 includes logic elements 41 connected via reconfigurable, non-volatile switches 43. Switches 43 may comprise, for example, carbon-based switching elements, such as CNT or graphene-based elements. ASIC logic element 200 can be interconnected internally to the logic element block and externally to the logic element block via a metal, graphene or CNT interconnect 42. In its simplest form, the field-programmable ASIC may have a single layer of horizontal metal or CNT interconnect and a single layer of vertical metal or CNT interconnect. However, whereas ASICs according to the prior art included permanently-conductive metal vias formed between selective overlapping points of horizontal and vertical metal layers, ASICs according to embodiments of the present invention include, for example, metal, graphene or CNT layers interconnected by six-way (or more if connected to additional planar layers), selectively conductive (i.e. conductive if switched on, or non-conductive if switched off) CNT or graphene vias or switches 43. In this way, ASICs according to embodiments of the present invention are customizable. More specifically, as will be set forth in detail below with respect to FIG. 3, the functionality, or characterization, of the CNT-based field-programmable ASIC may be modified in the field by loading a different first-time initialization bit stream.

Figure 3:
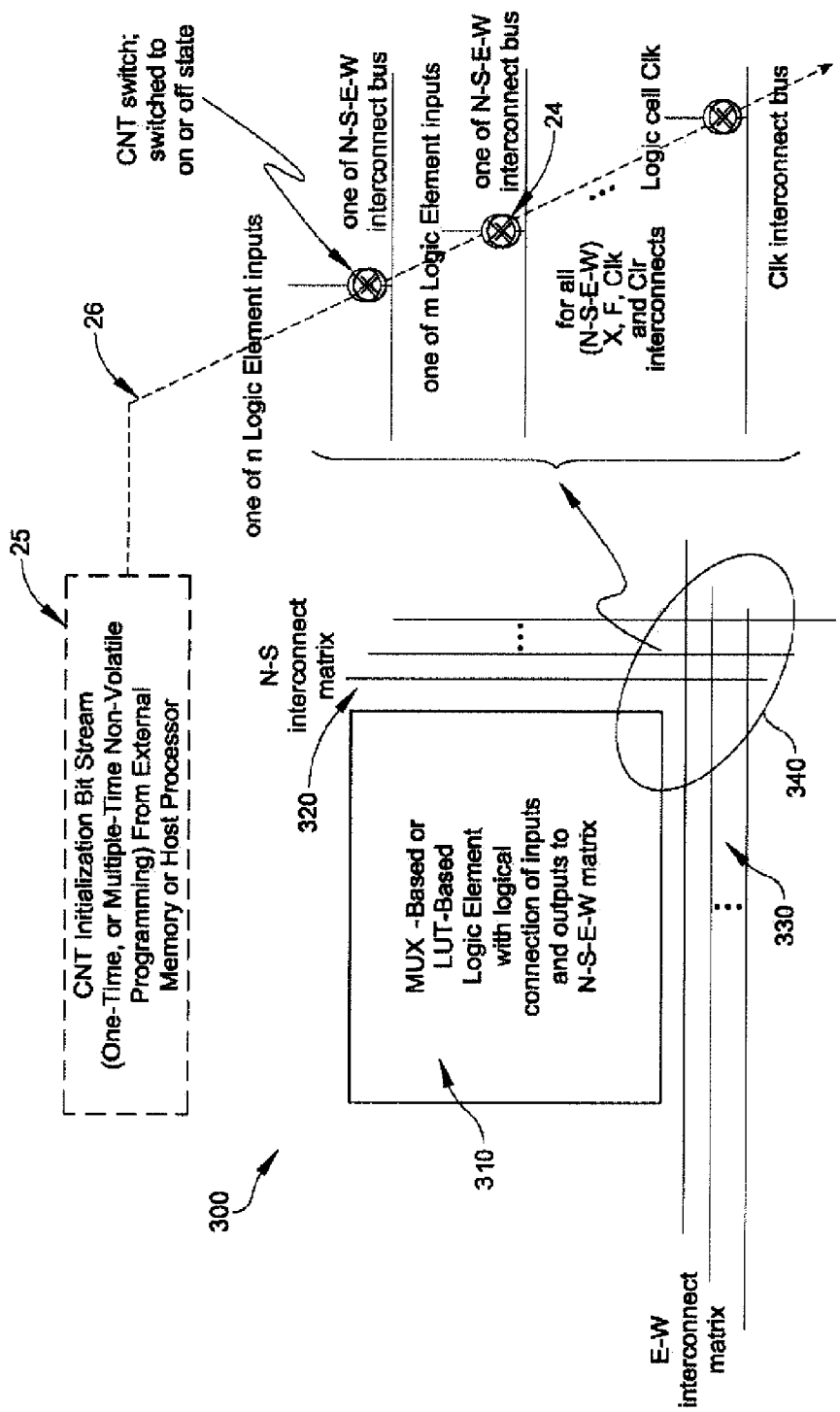
FIG. 3 is a simplified block diagram illustrating the graphene or carbon nanotube (CNT) switch-based interconnect between logic elements of an FPGA according to an embodiment of the present invention.

FIG. 3 is a simplified diagram in block and schematic form illustrating an embodiment of a CNT-based ASIC 300. ASIC 300 may include MUX-based or LUT-based logic elements 310 interconnected to a North-South (i.e. column) interconnect matrix 320 and an East-West (i.e. row) interconnect matrix 330 by a set 340 of reconfigurable, non-volatile graphene or CNT switch elements. Depending upon the particular application, greater performance (e.g. increased switch conductivity) may be obtained via graphene-based switch elements, by way of example. Logic elements 310 and the interconnect matrices or buses, are well known in the art and are, therefore, not described herein in further detail.

The CNT or graphene switches are initially in an unknown state at first-time power-up, and are then, at first-time power-up initialization, programmed to the proper logic one or zero state via an external memory source or from an external host processor 25 which provides a bit stream illustrated as a dotted line 26. On subsequent power-up initializations, however, the CNT or graphene switches do not need to be initialized as they are non-volatile and retain their programmed state. The initialization bit stream from the external memory or host processor is therefore no longer required for ordinary post-initialization operation and the internal FPA circuit behaves as a conventional ASIC. The functionality, or characterization, of the CNT or graphene-based FPGA may be modified in the field by loading a different first-time initialization bit stream.

Figure 4:
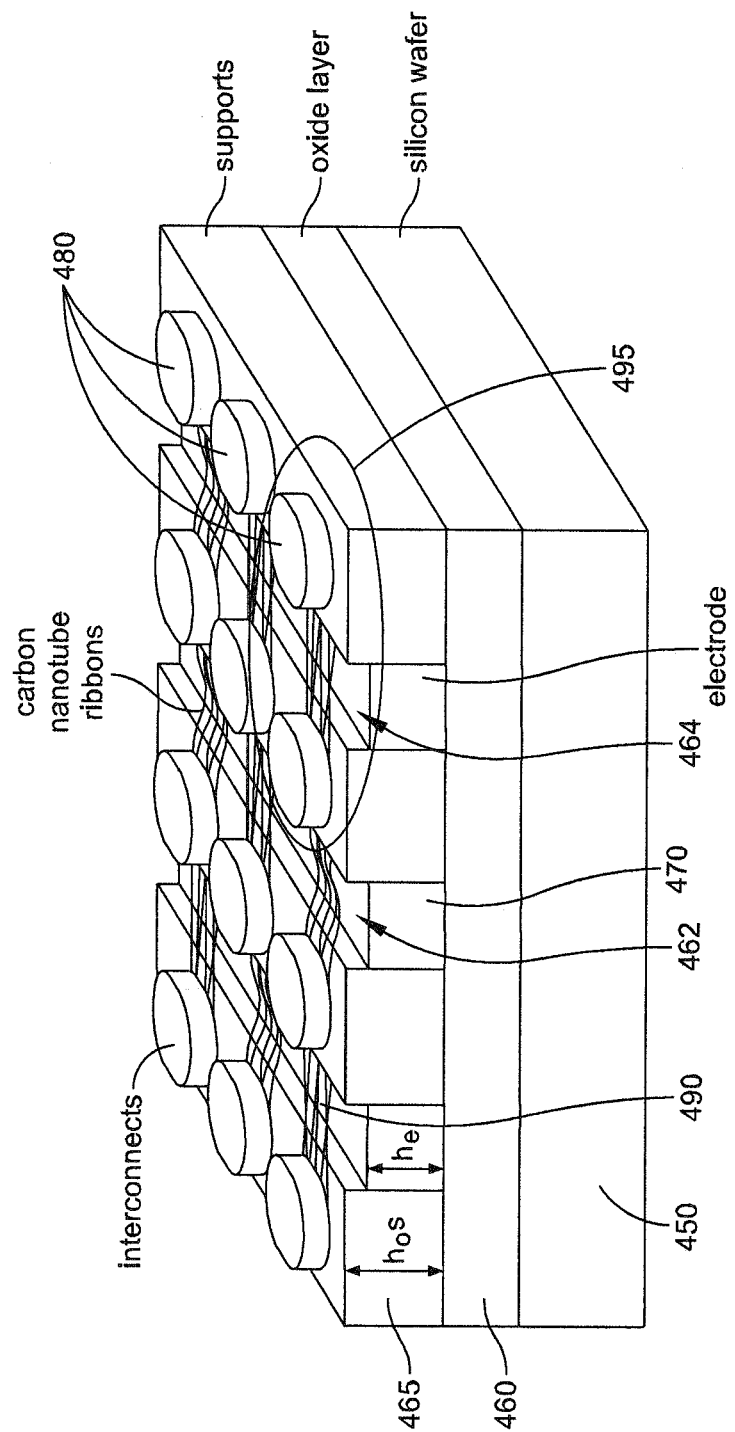
FIG. 4 is a simplified perspective view of a graphene or CNT-based ASIC according to an embodiment of the present invention.
Figure 5:
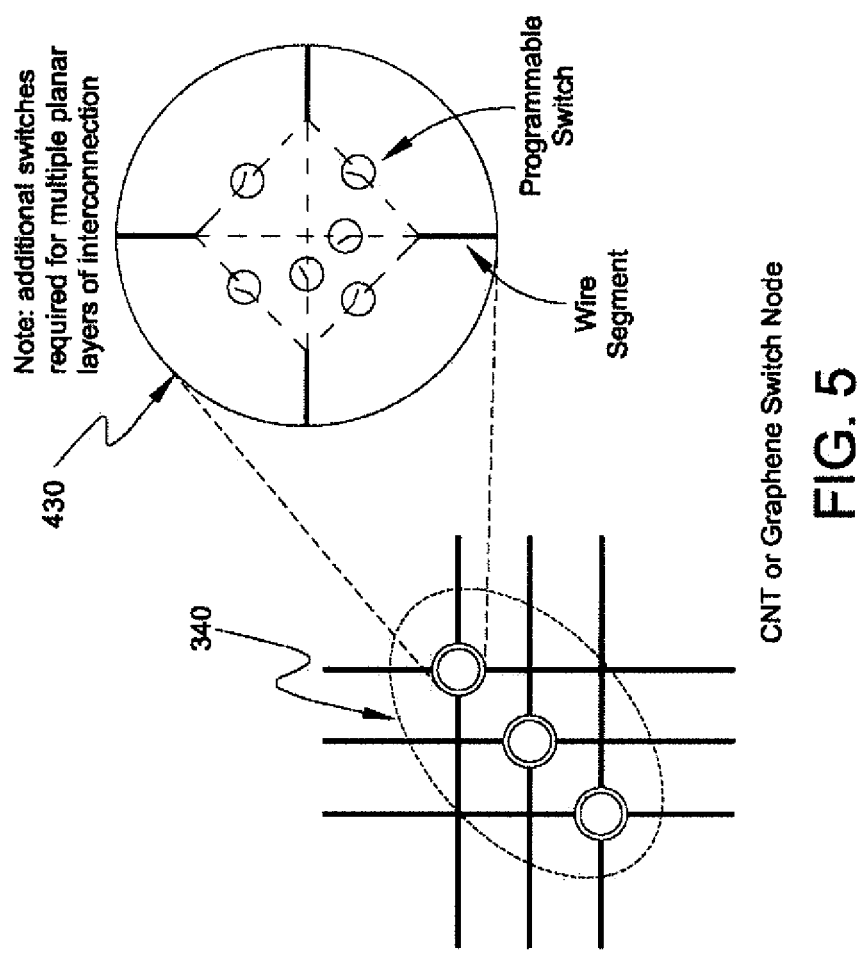
FIG. 5 is a simplified view of the graphene or CNT-based switch node used in embodiments of the present disclosure.

FIG. 4 illustrates a section of an ASIC CNT semiconductor switch useful for describing embodiments of the present invention. The ASIC 400 includes a semiconductor wafer portion 450 of silicon or any other suitable semiconductor material. An oxide layer 460 is disposed on or over the wafer portion 450. Disposed on the oxide layer 460 is a patterned oxide layer forming a plurality of spaced-apart, elongated oxide supports 465. A plurality of elongated metal electrodes 470 are disposed on the oxide layer 460 between the oxide supports 465. The electrodes 470 have a height $h_e$ which is less than the height $h_{os}$ of the oxide supports 465. A plurality of spaced-apart metal interconnects 480 are disposed on the oxide supports 465. Flexible CNT ribbons 490 extend transversely over the electrodes 470. The opposing ends of the CNT ribbons 490 are connected to laterally opposing ones of the metal interconnects 480. Each reconfigurable, non-volatile CNT switch 495 is formed by one of the flexible CNT ribbons 490 and its corresponding electrode 470 metal interconnects and oxide supports 465. In a simplified description of the normal operation of the CNT switch, the proper activation voltage for a one-state or a zero-state is applied to the respective metal interconnects 480, which places (i.e. switches) CNT ribbon 490 into the appropriate logic (i.e. on or off) state. The non-volatile switch can then be interrogated (with respect to the corresponding metal interconnect 480 and the corresponding electrode 470) to determine its state. In the embodiment of this disclosure, the state is not interrogated, but is instead used to facilitate an interconnection of the reconfigurable, non-volatile graphene or CNT switch elements 430, as illustrated in FIG. 5. In an embodiment of the disclosure, the CNT ribbons 490 contact the electrode layer for a "closed" switch or logical 1 state (462), while the CNT ribbon is suspended for an "open" switch or logical 0 state (464).

FIG. 5 illustrates the internal detail of the reconfigurable, non-volatile graphene or CNT switch element nodes 340 that connect the North-South interconnect matrix 320 to the East-West interconnect matrix 330. Each CNT or graphene switch element 430 contains a minimum of six switches to configure the desired routing. Note that additional switches would be required to interconnect to additional routing layers in other planes. It is anticipated that a minimum of two routing layers will normally be required.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. An application-specific integrated-circuit, comprising:
   a silicon wafer including:
      a preconfigured arrangement of a plurality of logic elements;
      a first interconnection layer defining a plurality of first electrical conductors extending in particular directions along at least portions of said silicon wafer, and
a second interconnection layer defining a further
plurality of second electrical conductors, extending
in other directions, different from said particular
directions, along at least said portions of said silicon
wafer, said first electrical conductors crossing said
second electrical conductors at a plurality of switch
cell locations each comprising a switch cell, said first
and second electrical conductors being electrically
discontinuous at said plurality of switch cell locations so that each switch cell is associated with first
and second ends of one of said first electrical conductors, and is also associated with first and second
ends of one of said second electrical conductors; and
electrical connections among at least some of said logic
elements and at least some of said first and second
electrical conductors;
a first oxide layer disposed on the silicon wafer;
a patterned oxide layer disposed on the first oxide layer,
the patterned oxide layer forming a plurality of spaced-apart elongated oxide support members;
a plurality of elongated metal electrodes disposed on the
first oxide layer between ones of the plurality of
spaced-apart elongated oxide support members;
a plurality of spaced-apart metal interconnects disposed
on the each of the plurality of spaced-apart elongated
oxide support members, each of said plurality of
spaced-apart metal interconnects being connected to
one of the first and second electrical conductors;
a plurality of flexible carbon nanotube (CNT) ribbons
extending transversely over the plurality of elongated
metal electrodes between pairs of metal interconnects;
at least first, second, third, fourth, fifth, and sixth electrical
nanotube switches associated with each of said switch
cells, each of said nanotube switches being settable to
a particular state, and retaining said particular state in
the absence of power applied to said integrated-circuit,
wherein each of nanotube switches is formed by a pair
of the metal interconnects and corresponding transverse CNT ribbons between the pair of the metal
interconnects;
said first one of said nanotube switches associated with
one of said switch cells and having first and second
terminals directly connected to said first and second
ends of said one of said first electrical conductors for
directly providing switchable connection between
said first and second ends of said one of said first
electrical conductors having a discontinuity in said
one of said switch cells,
said second one of said nanotube switches associated
with said one of said switch cells and having first and
second terminals directly connected to said first and
second ends of said one of said second electrical
conductors for directly providing switchable connection between said first and second ends of said one of
said second electrical conductors,
said third one of said nanotube switches associated with
said one of said switch cells and having first and
second terminals directly connected to said first end
of said one of said first electrical conductors and said
first end of said one of said second electrical conductors for directly providing switchable connection
between said first end of said one of said first
electrical conductors and said first end of said one of
said second electrical conductors,
said fourth one of said nanotube switches associated
with said one of said switch cells and having first and
second terminals directly connected to said first end
of said one of said first electrical conductors and said
second end of said one of said second electrical
conductors for directly providing switchable connection between said first end of said one of said first
electrical conductors and said second end of said one
of said second electrical conductors,
said fifth one of said nanotube switches associated with
said one of said switch cells and having first and
second terminals directly connected to said second
end of said one of said first electrical conductors and
said first end of said one of said second electrical
conductors for directly providing switchable connection between said second end of said one of said first
electrical conductors and said first end of said one of
said second electrical conductors, and
said sixth one of said nanotube switches associated
with said one of said switch cells and having first and
second terminals directly connected to said second
end of said one of said first electrical conductors and
said second end of said one of said second electrical
conductors for directly providing switchable connection between said second end of said one of said first
electrical conductors and said second end of said one
of said second electrical conductors; and
a host processor for selectively setting the states of said
first, second, third, fourth, fifth, and sixth nanotube
switches of each of said switch cells, said host processor thereby establishing a selected configuration of said
logic elements to cause said integrated-circuit to perform at least one selected function.

2. An application-specific integrated-circuit according to claim 1, wherein said host processor is external to said integrated-circuit.

3. An application-specific integrated-circuit according to claim 1, wherein said nanotube switches are graphene-based elements.

4. An application-specific integrated-circuit according to claim 1, wherein the first and second interconnection layers comprise metal layers.

5. An application-specific integrated-circuit according to claim 1, wherein the first and second interconnection layers comprise graphene layers.

6. An application-specific integrated-circuit according to claim 1, wherein the first and second interconnection layers comprise carbon nanotube layers.

7. An application-specific integrated-circuit comprising:
a silicon wafer including:
  a preconfigured arrangement of a plurality of logic elements;
  a first interconnection layer defining a plurality of first electrical conductors that extend in particular directions along at least portions of the silicon wafer;
  a second interconnection layer defining a plurality of second electrical conductors that extend in other directions, different from the particular directions, along at least the portions of the silicon wafer;
  the first electrical conductors crossing the second electrical conductors at a plurality of switch cell locations each comprising a switch cell, the first and second electrical conductors being electrically discontinuous at the plurality of switch cell locations so that each switch cell is associated with first and second ends of one of the first electrical conductors, and also associated with first and second ends of one of the second electrical conductors;

wherein electrical connections are provided among at least some of the logic elements and at least some of the first and second electrical conductors; and a first oxide layer disposed on the silicon wafer;

a patterned oxide layer disposed on the first oxide layer, the patterned oxide layer forming a plurality of spaced-apart elongated oxide support members;

a plurality of elongated metal electrodes disposed on the first oxide layer between ones of the plurality of spaced-apart elongated oxide support members;

a plurality of spaced-apart metal interconnects disposed on the each of the plurality of spaced-apart elongated oxide support members, each of said plurality of spaced-apart metal interconnects being connected to one of the first and second electrical conductors;

a plurality of flexible carbon nanotube (CNT) ribbons extending transversely over the plurality of elongated metal electrodes between pairs of metal interconnects;

wherein at least first, second, third, fourth, fifth, and sixth electrical nanotube switches are associated with each of the switch cells, wherein first and second terminals of the nanotube switches are directly connected to ends of the electrical conductors and are configured to directly provide selective continuity between said ends of the electrical conductors of each of the switch cells; each of the nanotube switches settable to a particular continuity state, and retaining the particular state in the absence of power applied to the integrated-circuit, wherein each of nanotube switches is formed by a pair of the metal interconnects and corresponding transverse CNT ribbons between the pair of the metal interconnects.

8. An application-specific integrated-circuit according to claim 7, wherein the first one of the nanotube switches associated with one of the switch cells provides a direct switchable connection between the first and second ends of one of the first electrical conductors having a discontinuity in one of the switch cells.

9. An application-specific integrated-circuit according to claim 7, further comprising a host processor for selectively setting the states of said first, second, third, fourth, fifth, and sixth nanotube switches of each of said switch cells, said host processor thereby establishing a selected configuration of said logic elements to cause said integrated-circuit to perform at least one selected function.

10. An application-specific integrated according to claim 9, wherein said host processor is external to said integrated-circuit.

11. An application-specific integrated-circuit according to claim 7, wherein said nanotube switches are graphene-based elements.

* * * * *